United States Patent [19]

Miyamoto et al.

[11] Patent Number: 4,739,500
[45] Date of Patent: Apr. 19, 1988

[54] DYNAMIC RAM HAVING FOLDED BIT LINE STRUCTURE

[75] Inventors: Hiroshi Miyamoto; Michihiro Yamada, both of Hyogo, Japan

[73] Assignee: Mitsubishi Denki Kabushiki Kaisha, Tokyo, Japan

[21] Appl. No.: 14,837

[22] Filed: Feb. 13, 1987

[30] Foreign Application Priority Data

Feb. 25, 1986 [JP] Japan .................................. 61-41043

[51] Int. Cl.[4] .......................... G11C 7/02; G11C 7/00
[52] U.S. Cl. ..................................... 365/207; 365/189; 365/222
[58] Field of Search ............... 365/189, 230, 205, 210, 365/207, 222

[56] References Cited

U.S. PATENT DOCUMENTS 4,493,056  1/1985  Mao ...................................... 365/149
4,651,306  5/1987  Yanagisawa ........................ 365/210
4,656,613  4/1987  Norwood et al. ................... 365/210

FOREIGN PATENT DOCUMENTS 101093  6/1984  Japan .

OTHER PUBLICATIONS

Digest of Technical Papers, ISSCC 84, pp. 278-279, Feb. 12, 1984, Kung et al.

Primary Examiner—Terrell W. Fears
Assistant Examiner—Melissa J. Koval
Attorney, Agent, or Firm—Lowe, Price, LeBlanc, Becker & Shur

[57] ABSTRACT

A dynamic RAM comprises a sense amplifier and a restore circuit for each pair of divided bit lines. Sense operation can be performed in a fast and stable manner and the gate voltage of a transfer gate transistor need not be boosted over the power supply potential, so that the access time of the dynamic RAM can be reduced, operation margin thereof is increased, and reliability is improved.

7 Claims, 7 Drawing Sheets

DYNAMIC RAM HAVING FOLDED BIT LINE STRUCTURE

BACKGROUND OF THE INVENTION

1. Field of the Invention

The present invention relates to a dynamic random access memory (dynamic RAM) formed by a MOS process.

2. Description of the Prior Art

A dynamic RAM generally employs a memory cell comprising a single transistor and a single capacitor. In this case, the smaller the ratio of capacitance of a bit line to capacitance of a capacitor in a memory cell is, the larger amount of change in potential on a bit line at the time of read-out is, and the larger input potential difference for a sense amplifier is, so that read-out operation is ensured. However, as density of a memory is largerly increased and integration increases, the size of a memory cell becomes smaller, so that capacitance of a capacitor is reduced. On the other hand, since the number of memory cells connected to a single bit line increases, a bit line becomes longer, so that capacitance of a bit line tends to increase. As a result, the ratio of capacitance of a bit line to capacitance of a capacitor increases, so that read-out operation may not be ensured.

To solve this problem, a single bit line is divided into a plurality of blocks so that the ratio of capacitance of a capacitor and capacitance of a bit line may be reduced. Two examples related to such a trial are described in the following.

FIG. 3 is a diagram showing a part of a structure of a conventional dynamic RAM, which is disclosed in an article of Digest of Technical Papers, ISSCC 84, pp. 278-279. In FIG. 3, a so-called shared sense amplifier structure is shown wherein a pair of bit lines are divided into two parts $\overline{BL1}$ and $\overline{BL2}$ and and a sense amplifier is shared with each pair of divided bit lines. In the above described document, a transistor in a memory cell comprises a P channel transistor, a sense amplifier comprises a P channel transistor, and a restore circuit comprises an N channel transistor. For simplicity, the conductivity type of these transistors is inverted in FIG. 3.

In FIG. 3, a pair of bit lines constituting a folded bit line are divided into divided bit lines BL1, BLN and BL2 and divided bit lines $\overline{BL1}$, $\overline{BLN}$ and $\overline{BL2}$, respectively. A sense amplifier SA is connected to the divided bit lines BLN and $\overline{BLN}$, a restore circuit RE1 is connected to the divided bit lines BL1 and $\overline{BL1}$, and a restore circuit RE2 is connected to the divided bit lines BL2 and $\overline{BL2}$. The sense amplifier SA comprises N channel transistors QN1 and QN2 as described above, and the restore circuits RE1 and RE2 comprise P channel transistors QP1 and QP2 and QP3 and QP4, respectively.

The transistors QN1 and QN2 have sources connected to a common sense amplifier driver transistor QN5. The transistor QN5 has a gate receiving a sense amplifier activating signal SN. The transistors QP1 and QP2 have sources connected to a common restore circuit driver transistor QP5, and the transistors QP3 and QP4 have sources connected to a common restore circuit driver transistor QP6. The transistors QP5 and QP6 have gates receiving restore circuit activating signals SP1 and SP2, respectively.

The divided bit lines BL1 and BLN and BLN and BL2 are connected to each other through transfer gate transistors QT1 and QT3, respectively, and the divided bit line $\overline{BL1}$ and $\overline{BLN}$ and $\overline{BLN}$ and $\overline{BL2}$ are connected to each other through transfer transistors QT2 and QT4, respectively. The transfer gate transistors QT1 and QT2 have gates receiving a transfer signal T1, the transfer gate transistors QT3 and QT4 have gates receiving a transfer signal T2.

The divided bit lines BL1 and $\overline{BL1}$ are connected to bus lines BU and $\overline{BU}$ through column gate transistors QY1 and QY2. The column gate transistors QY1 and QY2 have gates receiving a column selecting signal Y.

Although a plurality of memory cells are connected to each of the divided bit lines, depending on memory capacity, only a memory cell MC1 connected to the divided bit line BL2 is typically shown herein. The memory cell MC1 comprises a capacitor CS and a transistor QS. The transistor QS has a gate being a part of a word line WL1. In addition, the capacitor CS has one electrode connected to a memory cell plate potential $V_{SG}$.

Referring now to FIG. 4 which is a waveform diagram showing operation, operation of the circuit shown in FIG. 3, is described when the capacitor CS in the memory cell MC1 connected to the divided bit line BL2 is not charged, that is, when information "0" is stored in the memory cell MC1.

At the time $t_0$, the transfer signal T1 becomes an "L" level. Accordingly, the divided bit lines BLN and BL1 and $\overline{BLN}$ and $\overline{BL1}$ are isolated, respectively. Before the time $t_0$, the divided bit lines BL1, $\overline{BL1}$, BL2, $\overline{BL2}$, BLN and $\overline{BLN}$ are precharged at an intermediate potential $V_{CC}-V_{SS})/2$. At the time $t_1$, the selected word line WL1 becomes an "H" level. Accordingly, the transistor QS is turned on. As a result, the potential on the divided bit line BL2 slightly lowers, so that potential difference occurs between the divided bit lines BL2 and $\overline{BL2}$. At the time $t_2$, the sense amplifier activating signal SN becomes an "H" level. As a result, potential difference is increased between the divided bit lines BL2 and $\overline{BL2}$. More specifically, the potential on the divided bit line $\overline{BL2}$ is held near the intermediate potential, while the divided bit line BL2 is discharged through the transfer gate transistor QT3 and the sense amplifier SA, so that the potential thereon becomes near a ground potential $V_{SS}$. At the time $t_3$, the restore circuit activating signal SP2 becomes an "L" level. Accordingly, the potential on the divided bit line $\overline{BL2}$ is pulled up near a power supply potential $V_{CC}$. As a result, potential difference is further increased between the divided bit lines BL2 and $\overline{BL2}$. At the time $t_4$, the transfer signal T1 becomes again an "H" level. Thus, the potentials on the divided bit lines BLN and $\overline{BLN}$ are transferred to the divided bit lines BL1 and $\overline{BL1}$, respectively. As a result, the divided bit line BL1 is discharged, so that the potential thereon becomes near the ground potential $V_{SS}$, while the potential on the divided bit line $\overline{BL1}$ is pulled up. At the time $t_5$, the restore circuit activating signal SP1 becomes an "L" level. As a result, the potential on the divided bit line $\overline{BL1}$ is pulled up near the power supply potential $V_{CC}$. At the time $t_6$, the column selecting signal Y becomes an "H" level. Thus, the potentials on the divided bit lines BL1 and $\overline{BL1}$ are transferred to the bus lines BU and $\overline{BU}$, so that information "0" stored in the memory cell MC1 is read out.

As described in the foregoing, information stored in the capacitor CS in the memory cell MC1 is first read out to the divided bit line BL2, so that potential difference between the divided bit lines BL2 and $\overline{BL2}$ is amplified by the sense amplifier SA. The divided bit line BL2 is discharged at the sense amplifier SA through the transfer gate transistor QT3. The dynamic RAM with a folded bit line structure is generally formed of low resistance materials such as aluminum or refractory metal silicide. As a result, resistance of a bit line can be reduced, so that discharge of charges on the bit line can be accelerated.

However, in the dynamic RAM with a shared sense amplifier structure as described above, a transfer gate transistor is provided between a divided bit line connected to a memory cell and a sense amplifier, so that a bit line is not formed of low resistance materials in this transistor portion. In addition, as shown in FIG. 3, since the transfer gate transistor must be provided for each pitch between bit lines, the transistor width can be made almost the same as or at most twice the pitch between bit lines. In consideration of the pitch between bit lines, the pitch between bit lines is, for example, about 3 μm in a 1 Mega-bit dynamic RAM. Therefore, the transistor width of the transfer gate transistor is limited to less than several μm. Accordingly, conductance of the transfer gate transistor is reduced, so that discharge of charges on the divided bit line is delayed when the sense amplifier operates.

Furthermore, since a source and a drain of a transfer gate transistor are formed of a diffusion layer provided in a substrate or a well, noise is transferred to a bit line through the substrate or the well, so that the sense amplifier erroneously operates.

FIG. 5 illustrates a circuit which is disclosed in the Japanese Laying-Open Gazette No. 101093/1984, as another conventional example of interest to the present invention. The circuit shown in FIG. 5 comprises only an N channel transistor, and a bit line is divided into three parts. The divided bit lines BL4 and $\overline{BL4}$ are connected to an active pull-up circuit AP and a bit line precharge circuit BC. The transfer gate transistors QT1, QT2, QT3 and QT4 are connected between the divided bit lines, and the column gate transistors QY1 and QY2 are connected between the divided bit line BL4 and the bus line BU and between the divided bit line $\overline{BL4}$ and the bus line $\overline{BU}$. A sense amplifier SA5 is connected to the divided bit lines BL5 and $\overline{BL5}$, while a sense amplifier SA6 is connected to the divided bit lines $\overline{BL6}$. Furthermore, although a plurality of memory cells are connected to each of the divided bit lines, respectively, only a memory cell MC1 connected to the divided bit line BL5 out of memory cells connected to each of the divided bit lines is shown herein. The memory cell MC1 comprises the capacitor CS and the transistor QS. The transistor QS has a gate being a part of the word line WL1. The capacitor CS has on electrode connected to the memory cell plate potential $V_{SG}$.

Referring now to FIG. 6 showing waveforms of operation, operation of the circuit shown in FIG. 5 is described when the capacitor CS in the memory cell MC1 is not charged, that is, when information "0" is stored in the memory cell MC1.

Before the time $t_0$, both a transfer signal BSC and a reset signal RST are at an "H" level, and all the transfer gate transistors QT1, QT2, QT3 and QT4 are turned on. Thus, the divided bit lines BL4, BL5 and BL6 are connected to each other, and the divided bit lines $\overline{BL4}$, $\overline{BL5}$ and $\overline{BL6}$ are connected to each other. In addition, since the reset signal RST becomes an "H" level, a bit line precharge circuit BC operates. As a result, each of the divided bit lines is precharged, so that the potential thereon becomes the intermediate potential $(V_{CC}-V_{SS})/2$.

At the time $t_0$, both the transfer signal BSC and the reset signal RST become an "L" level. At the time $t_1$, the potential on the selected word line WL1 becomes an "H" level. As a result, the potential on the divided bit line BL5 slightly lowers, so that potential difference occurs between the divided bit lines BL5 and $\overline{BL5}$. At the time $t_2$, a sense amplifier activating signal SN5 become an "H" level. Accordingly, the sense amplifier SA5 operates. As a result, so that potential difference is increased between the divided bit lines BL5 and $\overline{BL5}$. At the time $t_3$, the transfer signal BSC becomes an "H" level. Accordingly, the transfer gate transistors QT1, QT2, QT3 and QT4 are turned on, so that the potential on the divided bit lines BL5 and $\overline{BL5}$ are transferred to the divided bit lines BL4 and BL6 and $\overline{BL4}$ and $\overline{BL6}$, respectively. At the time $t_4$, the sense amplifier activating signal SN6 becomes an "H" level. As a result, potential difference is increased between the divided bit lines BL6 and $\overline{BL6}$ and thus, potential difference is increased between the divided bit lines BL4 and $\overline{BL4}$ and between the divided bit lines BL5 and $\overline{BL5}$. At the time $t_5$, an active pull-up signal APE becomes an "H" level. Accordingly, an active pull-up circuit APE operates. As a result, the potential on the divided bit line $\overline{BL4}$, $\overline{BL5}$ and $\overline{BL6}$ is pulled up near the power supply potential $V_{CC}$. When the column selecting signal Y becomes an "H" level, the potentials on the divided bit lines BL4 and $\overline{BL4}$ are transferred to the bus lines BU and $\overline{BU}$, respectively, so that information is read out.

As described in the foregoing, in the circuit shown in FIG. 5, a sense amplifier is provided for each of the divided bit lines, while an active pull-up circuit is provided not for each of the divided bit lines but for an entire bit line. Therefore, since the potential on the entire bit line must be pulled up by an active pull-up circuit when the active pull-up circuit operates, an active pull-up circuit having large drive capacity is required. This increases the area occupied by the active pull-up circuit.

Additionally, in order to pull up the potential on each of the divided bit lines to the power supply potential $V_{CC}$, the gate potential of the transfer gate transistor, that is, the transfer signal BSC must be boosted over the power supply potential $V_{CC}$. However, as integration of memory increases, a gate oxide film of the transistor tends to be thinner. For example, the gate oxide film in a 1 Mega-bit dynamic RAM is about 200 to 300Å in thickness. Therefore, if the gate potential is boosted over the power supply potential, reliability of the gate oxide film is deteriorated.

SUMMARY OF THE INVENTION

An object of the present invention is to solve the above described problems of the conventional dynamic RAM and to provide a dynamic RAM in which information is read out in a fast and stable manner, and a reliable gate oxide film is formed.

According to the present invention, since a sense amplifier and a restore circuit are provided for each of divided bit lines, a dynamic RAM can be obtained in which the access time is fast and operating margin is wide.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
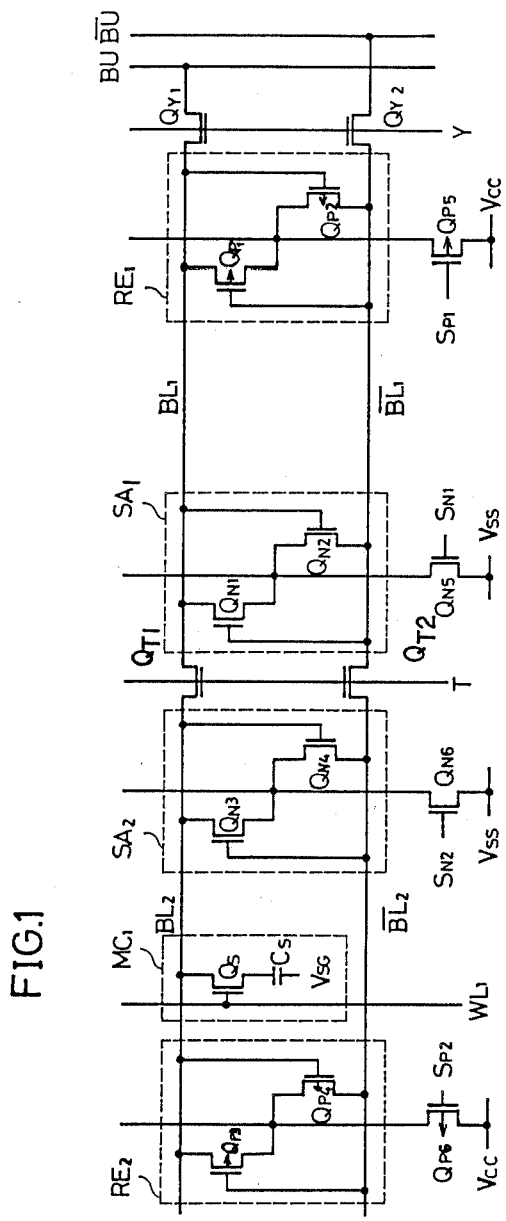
FIG. 1 is a circuit diagram showing a part of a structure of a dynamic RAM according to an embodiment of the present invention.

FIG. 1 is a circuit diagram showing a part of a structure of a dynamic RAM according to an embodiment of the present invention. Referring to FIG. 1, a pair of bit lines with a folded bit line structure are divided into two parts, for example, BL1 and $\overline{BL1}$ and BL2 and $\overline{BL2}$. A sense amplifier SA1 and a restore circuit RE1 are connected to the divided bit lines BL1 and $\overline{BL1}$. The sense amplifier SA1 comprises N channel transistors QN1 and QN2, and the restore circuit RE1 comprises P channel transistors QP1 and QP2. A sense amplifier SA2 and a restore circuit RE2 are connected to the divided bit lines BL2 and $\overline{BL2}$. The sense amplifier SA2 comprises N channel transistors QN3 and QN4, and the restore circuit RE2 comprises P channel transistors QP3 and QP4.

The transistors QN1 and QN2 constituting the sense amplifier SA1 have sources connected to a common sense amplifier driver transistor QN5, and the transistors QN3 and QN4 constituting the sense amplifier SA2 have sources connected to a common sense amplifier driver transistor QN6. The transistors QN5 and QN6 have gates receiving sense amplifier activating signals SN1 and SN2, respectively.

The transistors QP1 and QP2 constituting the restore circuit RE1 have sources connected to a common restore circuit driver transistor QP5, and the transistors QP3 and QP4 constituting the restore circuit RE2 have sources connected to a common restore circuit driver transistor QP6. The transistors QP5 and QP6 have gates receiving restore circuit activating signals SP1 and SP2, respectively.

The divided bit lines BL1 and BL2 and $\overline{BL1}$ and $\overline{BL2}$ are connected to each other through transfer gate transistors QT1 and QT2, respectively. The transistors QT1 and QT2 have gates receiving a transfer signal T.

The divided bit line BL1 and a bus line BU and the divided bit line $\overline{BL1}$ and a bus line $\overline{BU}$ are connected to each other through column gate transistors QY1 and QY2. The transistors QY1 and QY2 have gates receiving a column selecting signal Y.

Although memory cells are connected to each of the divided bit lines, depending on memory capacity, only a memory cell MC1 connected to the divided bit line BL2 is typically shown herein. The memory cell MC1 comprise a capacitor CS and a transistor QS. The transistor QS has a gate being a part of a word line WL1. In addition, the capacitor CS has one electrode connected to a memory cell plate potential $V_{SG}$.

Figure 2A:
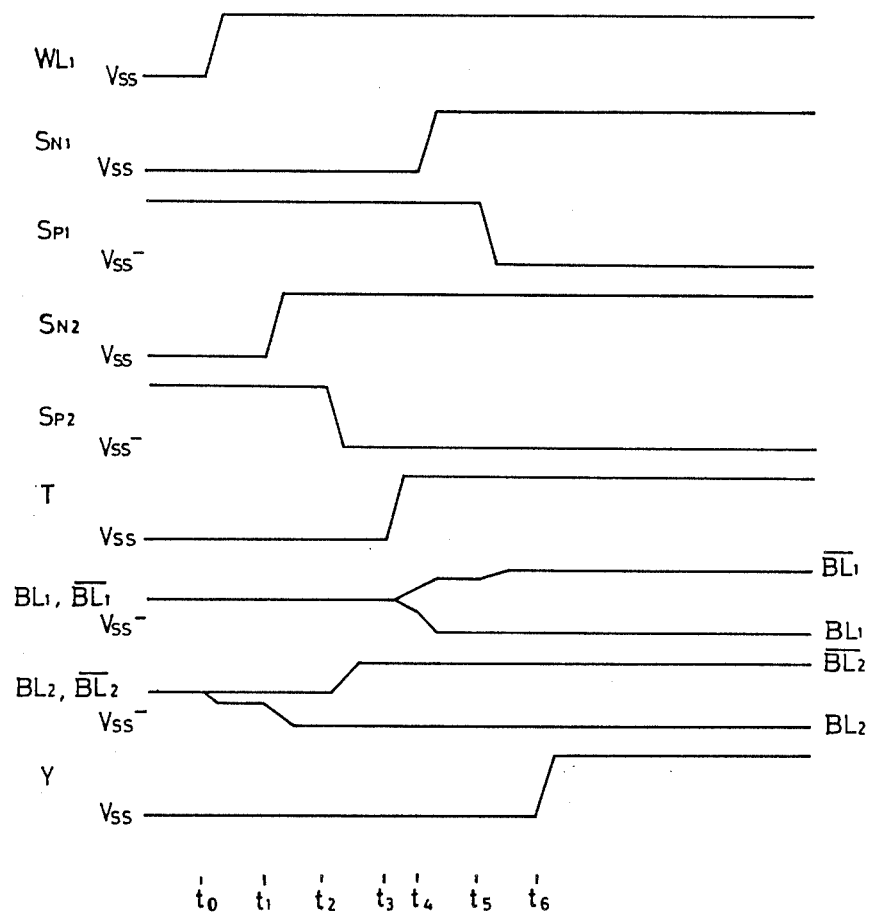
FIGS. 2A and 2B are waveform diagrams showing a part of operation of the circuit shown in FIG. 1.

Operation of the circuit shown in FIG. 1 is now described. Referring to FIG. 2A which is a waveform diagram showing operation, operation is described when the capacitor CS in the memory cell MC1 is not charged, that is, when information "0" is stored in the memory cell MC1.

Before the time $t_0$, the divided bit lines BL1, $\overline{BL1}$, BL2 and $\overline{BL2}$ are precharged at an intermediate potential $(V_{CC}-V_{SS})/2$, and the transfer signal T becomes an "L" level.

At the time $t_0$, the selected word line WL1 becomes an "H" level. Accordingly, the transistor QS is turned on. As a result, the potential on the divided bit line $\overline{BL2}$ slightly lowers, so that potential difference occurs between the divided bit lines BL2 and $\overline{BL2}$. At the time $t_1$, the sense amplifier activating signal SN2 becomes an "H" level. As a result, the potential difference is increase between the divided bit lines BL2 and $\overline{BL2}$. More specifically, the potential on the divided bit line $\overline{BL2}$ is held near the intermediate potential, while the divided bit line BL2 is discharged through the sens amplifier SA2, so that the potential thereon becomes near a ground potential $V_{SS}$. At the time $t_2$, the restore circuit activating signal SP2 becomes an "L" level. As a result, the potential on the divided bit line $\overline{BL2}$ is pulled up near a power supply potential $V_{CC}$ through the restore circuit RE2, so that potential difference is further increased between the divided bit lines BL2 and $\overline{BL2}$.

At the time $t_3$, the transfer signal T becomes an "H" level. Thus, the potentials on the divided bit lines BL2 and $\overline{BL2}$ are transferred to the divided bit lines BL1 and $\overline{BL1}$. The divided bit line BL1 begins to be discharged through the transfer gate transistor QT1 and the sense amplifier SA2, while the potential on the divided bit line $\overline{BL1}$ begins to be pulled up from the intermediate potential through the transfer gate transistor QT2 and the restore circuit RE2. At the time $t_4$, the sense amplifier activating signal SN1 becomes an "H" level. Accordingly, the sense amplifier SA1 operates. As a result, the potential on the divided bit line BL1 is discharged near the ground potential $V_{SS}$. At the time $t_5$, the restore circuit activating signal SP1 becomes an "L" level. Accordingly, the restore circuit RE1 operates. As a result, the potential on the divided bit line $\overline{BL1}$ is pulled up near the power supply potential $V_{CC}$.

At the time $t_6$, the column selecting signal Y becomes an "H" level. Accordingly, the column gate transistors QY1 and QY2 are turned on. As a result, the potentials on the divided bit lines BL1 and $\overline{BL1}$ are transferred to the bus lines BU and $\overline{BU}$, respectively, so that information "0" stored in the memory cell MC1 is read out.

Figure 2B:
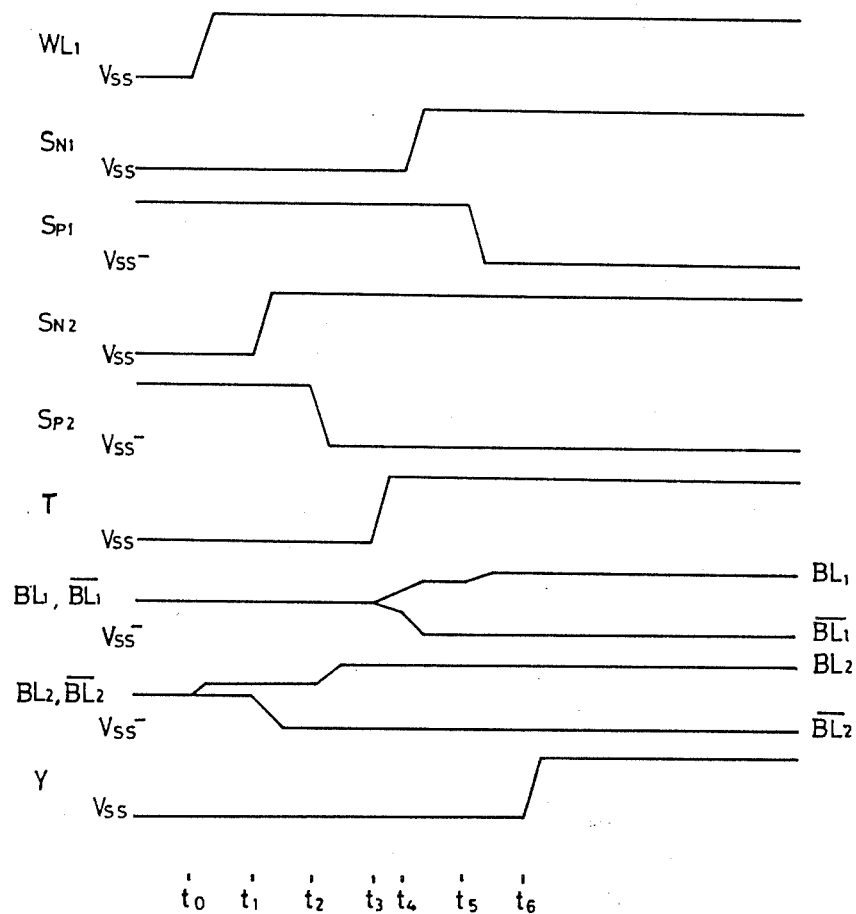
Figure 3:
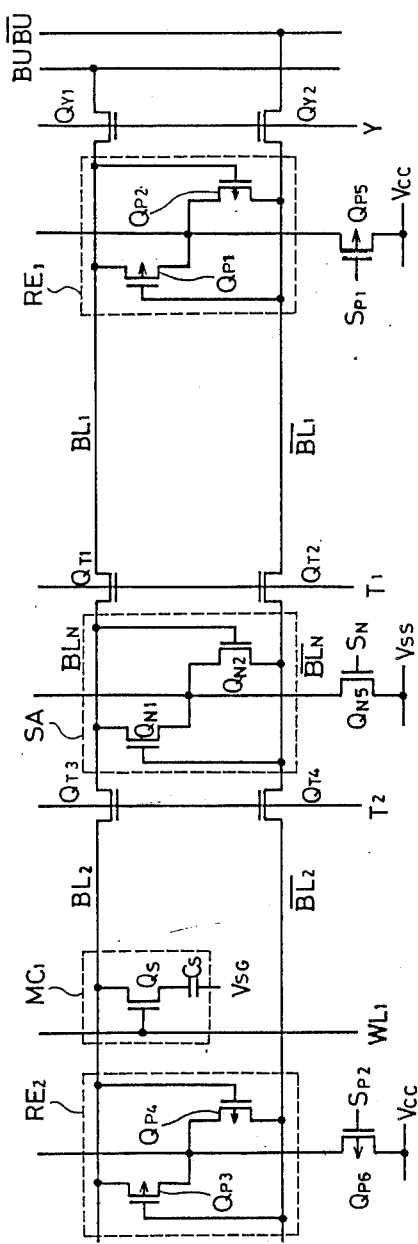
FIG. 3 is a circuit diagram showing a part of a structure of a conventional dynamic RAM.
Figure 4:
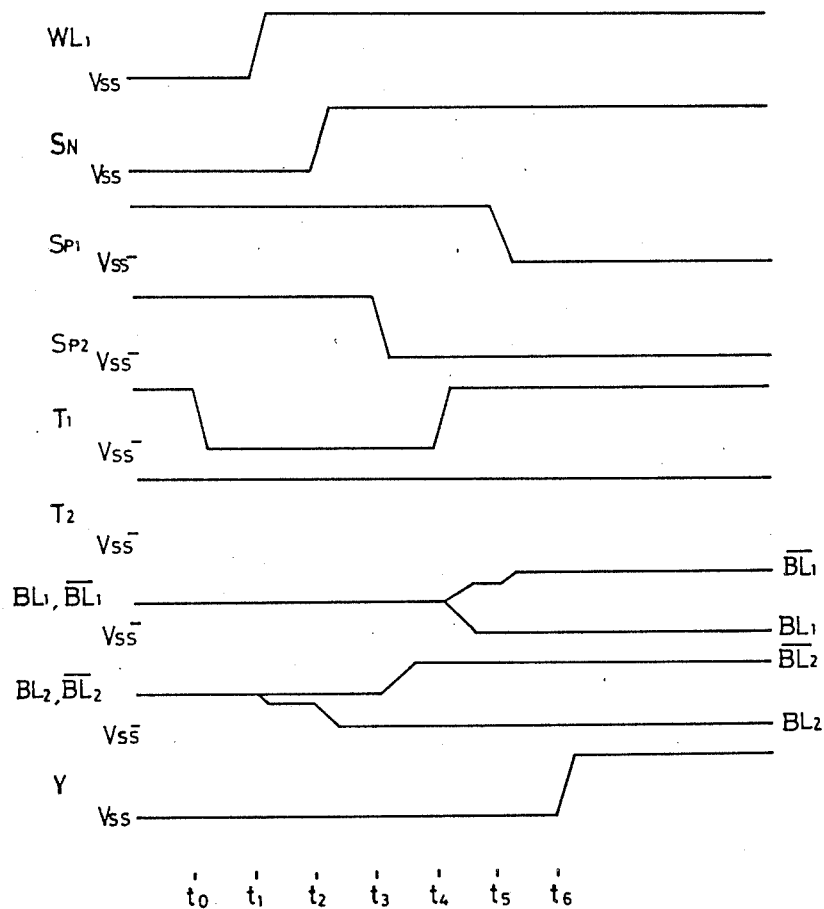
FIG. 4 is a waveform diagram showing a part of operation of the circuit shown in FIG. 3.
Figure 5:
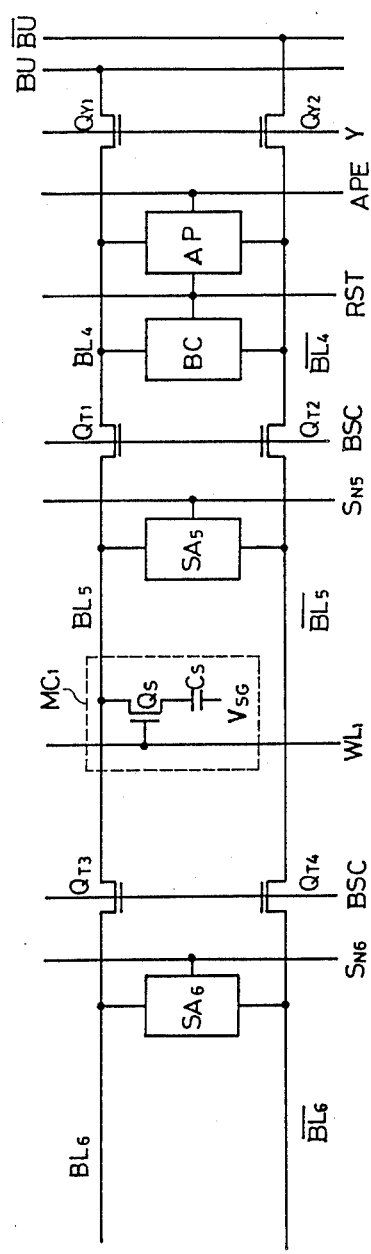
FIG. 5 is a circuit diagram showing a part of another structure of the conventional dynamic RAM.
Figure 6:
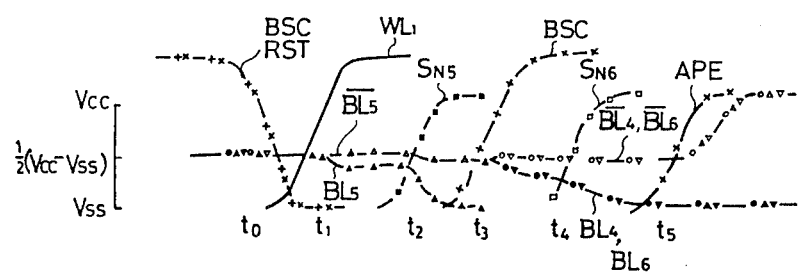
FIG. 6 is a waveform diagram showing a part of operation of the circuit shown in FIG. 5.

Referring now to FIG. 2B which is a waveform diagram showing operation, operation is described when the capacitor CS in the memory cell MC1 is not charged, that is, information "1" is stored in the memory cell MC1.

Precharge operation of the divided bit lines and operation in which the transfer signal T becomes an "L" level are performed as when information stored in the memory cell MC1 is "0".

At the time $t_0$, the potential on the selected word line WL1 becomes an "H" level. Accordingly, the transistor QS is turned on. As a result, the potential on the divided bit line BL2 slightly rises, so that potential difference occurs between the divided bit lines BL2 and $\overline{BL2}$. At the time $t_1$, the sense amplifier activating signal SN2 becomes an "H". As a result, potential difference is increased between the divided bit lines BL2 and $\overline{BL2}$. More specifically, the potential on the divided bit line BL2 is held at a little higher potential than the intermediate potential, while the divided bit line $\overline{BL2}$ is discharged through the sense amplifier SA2, so that the potential thereon becomes near the ground potential $V_{SS}$. At the time $t_2$, the restore circuit activating signal SP2 becomes an "L" level. As a result, the potential on the divided bit line BL2 is pulled up near the power supply potential $V_{CC}$ through the restore circuit RE2, so that potential difference is further increased between the divided bit lines BL2 and $\overline{BL2}$.

At the time $t_3$, the transfer signal T becomes an "H" level. Thus, the potential on the divided bit lines $\overline{BL2}$ and $\overline{BL2}$ are transferred to the divided bit lines BL1 and $\overline{BL1}$, respectively. As a result, the potential on the divided bit line $\overline{BL1}$ begins to be discharged through the transfer gate transistor QT2 and the sense amplifier SA2, while the potential on the divided bit line BL1 begins to be pulled up through the transfer gate transistor QT1 and the restore circuit RE2. At the time $t_4$, the sense amplifier activating signal SN1 becomes an "H" level. As a result, the divided bit line $\overline{BL1}$ is discharged, so that the potential thereon becomes near the ground potential $V_{SS}$. At the time $t_5$, the restore circuit activating signal SP1 becomes an "L" level. As a result, the potential on the divided bit line BL1 is pulled up near the power supply potential $V_{CC}$.

At the time $t_6$, the column selecting signal Y becomes an "L" level. As a result, information "1" is read out into the bus lines BU and $\overline{BU}$.

In the foregoing, the structure and the operation according to the preferred embodiment of the present invention ar described in detail.

Although in the above described embodiment, a sense amplifier comprising an N channel transistor is operated prior to a restore circuit comprising a P channel transistor, they may be operated in the other order, in which case the same effect as the present invention can be obtained. For example, the sense amplifier and the restore circuit may be operated at the same time. Furthermore, the restore circuit can be operated prior to the sense amplifier. In addition, the sense amplifier and the restore circuit may be operated at different timing.

Furthermore, although in the above described embodiment, a transfer gate transistor and a column gate transistor comprise N channel transistors, they may comprise transistors each having opposite conductivity type if signals applied to a gate of each transistor are suitably selected.

Furthermore, although in the above described embodiment, a transistor in a memory cell comprises an N channel transistor, it may comprise a p channel transistor if the potential on a word line is suitably selected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic RAM comprising:
   a plurality of word lines;
   a plurality of pairs of bit lines with a folded bit line structure, each of said plurality of pairs of bit lines being divided into a plurality of pairs of divided bit lines;
   first switching means provided between pairs of divided bit lines in each pair of bit lines to connect a pair of divided bit lines to the adjacent pair of divided bit lines;
   a plurality of memory cells arrayed in a matrix of rows and columns, each of said plurality of memory cells being connected to one of said plurality of word lines and to one of said divided bit lines;
   a plurality of sense amplifiers each provided for a different one of said pairs of divided bit lines for amplifying a signal appearing on a pair of divided bit lines, each of said sense amplifiers being formed of transistors of a first conductivity type;
   a plurality of restore circuits each provided for a different one of said divided bit lines, each of said restore circuits being formed of transistors of a second conductivity type opposite to said first conductivity type;
   first activating means for activating sense amplifiers and restore circuits included only in pairs of divided bit lines connected to memory cells selected by one of said word lines;
   second activating means for activating said first switching means after activation of said sense amplifiers and restore circuits by said first activating means; and
   third activating means for activating remaining sense amplifiers and restore circuits after activation of said first switching means.

2. A dynamic RAM in accordance with claim 1, comprising a pair of bus lines for reading data out of and writing data into a selected memory cell; and second switching means provided for each pair of bit lines to connect a selected pair of bit lines to said pair of bus lines.

3. A dynamic RAM in accordance with claim 1, wherein said first switching means comprises a transfer gate including a transistor.

4. A dynamic RAM in accordance with claim 2, wherein said first switching means comprises a transfer gate including a transistor.

5. A dynamic RAM in accordance with claim 4, wherein said second switching means comprises a transfer gate including a transistor.

6. In a dynamic RAM comprising a plurality of word lines; a plurality of pairs of bit lines with a folded bit line structure, each of said plurality of pairs of bit lines being divided into a plurality of pairs of divided bit lines; first switching means provided between pairs of divided bit lines in each pair of bit lines to connect a pair of divided bit lines to the adjacent pair of divided bit lines; a plurality of memory cells arrayed in a matrix of rows and columns, each of said plurality of memory cells being connected to one of said plurality of word lines and to one of said divided bit lines; a plurality of sense amplifiers, each provided for a different one of said pairs of divided bit lines for amplifying a signal appearing on a corresponding pair of divided it lines, each of said sense amplifiers being formed of transistors of a first conductivity type; a plurality of restore circuits, each provided for a different one of said divided bit lines, for amplifying a signal appearing on a corresponding pair of divided bit lines, each of said restore circuits being formed of transistors of a second conuctivity type opposite to said first conductivity type;
   a method of operating said RAM, comprising the steps of:

activating sense amplifiers and restore circuits included only in pairs of divided bit lines connected to memory cells selected by one of said word lines;

activating said first switching means after activation of said sense amplifiers and restore circuits; and activating remaining sense amplifiers and restore circuits after activation of said first switching means.

7. In the RAM in accordance with claim 6, further comprising a pair of bus lines for reading out of and writing data into a selected memory cell, the additional step of connecting a selected pair of bit lines to said pair of bus lines.

* * * * *